United States Patent
Lim et al.

(10) Patent No.: US 6,927,335 B2
(45) Date of Patent: Aug. 9, 2005

(54) ASSEMBLY STRUCTURE OF CASE AND THE ASSEMBLING METHOD THEREFOR

(75) Inventors: Choo Soo Lim, Samutprakarn (TH);
Sae-Ueng Kitti, Samutprakarn (TH);
Chun-Chen Chen, Taiwan (TW)

(73) Assignees: Delta Electronics, Inc., (TW); Delta Electronics (Thailand) Public Company, Limited, (TH)

( * ) Notice: Subject to any disclaimer, the term of this patent is extended or adjusted under 35 U.S.C. 154(b) by 0 days.

(21) Appl. No.: 10/936,246

(22) Filed: Sep. 8, 2004

(65) Prior Publication Data
US 2005/0115734 A1    Jun. 2, 2005

(30) Foreign Application Priority Data
Dec. 2, 2003    (TW) .............................. 92133951 A

(51) Int. Cl.$^7$ .............................................. H02G 3/08
(52) U.S. Cl. ............................ 174/50; 174/58; 174/63; 220/4.02; 439/535
(58) Field of Search ............................. 174/50, 58, 63, 174/17 R, 135; 220/4.02, 3.9, 3.8; 439/535; 248/906

(56) References Cited

U.S. PATENT DOCUMENTS

| | | | | |
|---|---|---|---|---|
| 6,069,315 A | * | 5/2000 | Tang ............................ | 174/50 |
| 6,800,807 B2 | * | 10/2004 | Ishiguro et al. ................ | 174/50 |
| 6,815,612 B2 | * | 11/2004 | Bloodworth et al. .......... | 174/50 |
| 6,816,381 B2 | * | 11/2004 | Takeuchi ..................... | 361/752 |
| 6,822,163 B2 | * | 11/2004 | Saneto et al. .................. | 174/50 |
| 6,848,916 B2 | * | 2/2005 | Nakayama et al. ......... | 439/76.2 |

* cited by examiner

Primary Examiner—Dhiru R. Patel
(74) Attorney, Agent, or Firm—Madson & Metcalf

(57) ABSTRACT

An assembly structure of a case is disclosed. The assembly structure includes an upper case and a lower case. The upper case has a connection portion having a first cavity, a first protrusion, a first trench and a second protrusion arranged from the external side to the internal side thereof. The lower case has a connection portion having a first cavity, a first protrusion and a second cavity arranged from the external side to the internal side thereof. Both the first cavity and the first protrusion of the upper case are opposite to the first cavity of the lower case, and the first trench and the second protrusion of the upper case are opposite to the first protrusion and the second cavity of the lower case, respectively, so as to assemble the upper case and the lower case.

21 Claims, 7 Drawing Sheets

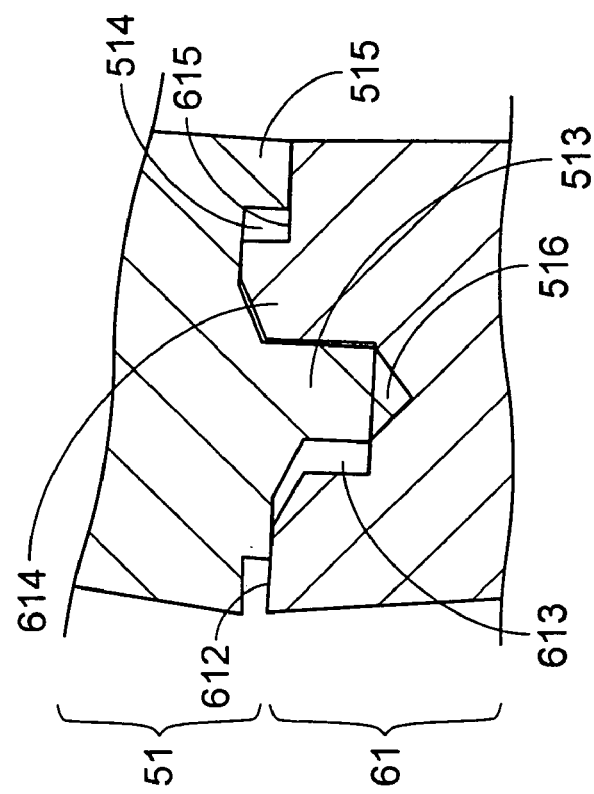
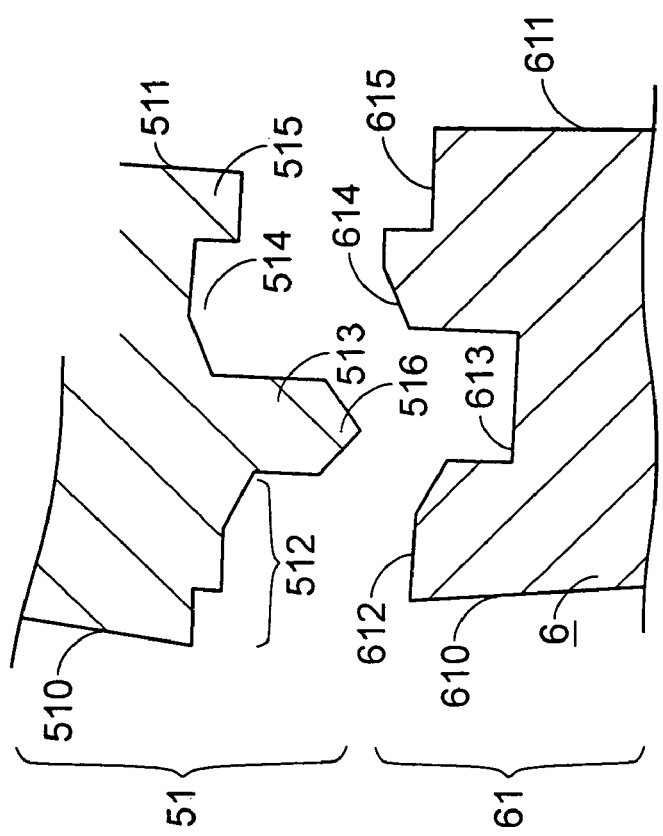

ASSEMBLY STRUCTURE OF CASE AND THE ASSEMBLING METHOD THEREFOR

FIELD OF THE INVENTION

The present invention relates to an assembly structure of a case and the assembling method therefor, and more particularly to an assembly structure of a case and the assembling method therefor which can decrease the formation of shade or flow mark on the case and increase the creepage distance of the assembled case.

BACKGROUND OF THE INVENTION

In our daily life, various electronic apparatuses and their accessories, such as power adapters, connectors, power supplies, plugs or sockets, etc., are widely used. Since the internal electronic elements and circuits of these electronic apparatuses or accessories need to be appropriately isolated and protected, they are covered by cases to avoid the contact with the external environment. The assembly structure of the case and the assembling method therefor will indirectly influence the appearances and the electrical properties of the electronic apparatuses or accessories, so it is important to design an appropriate assembly structure of the case and the assembling method therefor.

Please refer to FIG. 1, which is a schematic view showing the assembly structure of a conventional case. As shown in FIG. 1, the assembly structure of the conventional case is composed of an upper case 1 and a lower case 2. The upper case 1 has a connection portion 11 including a first protrusion 112, a first trench 113 and a second protrusion 114 arranged from the external side 110 to the internal side 111 of the upper case 1. The lower case 2 also has a connection portion 21 including a first cavity 212, a first protrusion 213 and a second cavity 214 arranged from the external side 210 to the internal side 211 of the lower case 2 and opposite to the first protrusion 112, the first trench 113 and the second protrusion 114 of the upper case 1, respectively. In addition, the first protrusion 213 of the lower case 2 has a protruding rib 215 thereon, and the width of the first protrusion 213 of the lower case 2 is slightly smaller than that of the first trench 113 of the upper case 1. Thereby, when the upper case 1 and the lower case 2 are assembled, the first protrusion 213 of the lower case 2 can be inserted into the first trench 113 of the upper case 1.

Please refer to FIGS. 2(a)–(b), which schematically show the assembling manner of the structure in FIG. 1. As shown in FIG. 2(a), when the upper case 1 and the lower case 2 are going to be assembled, the first protrusion 112, the first trench 113 and the second protrusion 114 of the upper case 1 are first put in opposition to the first cavity 212, the first protrusion 213 and the second cavity 214 of the lower case 2, respectively. Then, with the ultrasound principle, the ultrasound generated by the horn of an ultrasonic plastic welding machine produces ultra-frequent sonic vibration on the cases, so that the upper case 1 and the lower case 2 rub against each other violently and thus the protruding rib 215 on the first protrusion 213 of the lower case 2 can be welded into the inner wall of the first trench 113 of the upper case 1 in a very short time, as shown in FIG. 2(b), so as to achieve the purpose of assembling the upper case 1 and the lower case 2.

However, no matter adopting what assembly structure of the case, the upper case 1 and the lower case 2 are produced by plastic injection molding. As known by one skilled in the art, the products made from plastic injection molding usually have disadvantages of fracture, shade or flow mark, lack of gloss, or deformation and so on. In which, the reason that causes the formation of flow mark on the product of plastic injection molding includes: the material is not welded well; the temperature of the mode is too low; the injection rate is too fast or too slow; the injection pressure is too high or too low; or the thickness difference on the cross-section of the product is too large. The reason that causes the formation of shade on the product is the wall thickness of the connection portion of the case is uneven. Since the shade or flow mark will influence the appearance of the assembled case, how to reduce the formation of shade or flow mark is an important issue.

Please refer to FIG. 1 again. From the external side 110 to the internal side 111 of the upper case 1 of the assembly structure of the conventional case, due to the level difference between the first protrusion 112 and the first trench 113, the thickness difference on the cross-section of the connection portion 11 of the upper case 1 is too large or the wall thickness of the connection portion 11 of the upper case 1 is uneven. Therefore, after the upper case 1 is injection molded, the shade 120 or flow mark will be formed on the external side 110 of the connection portion 11. The bigger the level difference between the first protrusion 112 and the first trench 113 is, the bigger the range of the shade 120 or flow mark is, so that when the upper case 1 and the lower case 2 are assembled, the obvious shade 120 or flow mark will be formed on the external side of the case and the surface of the case will be less smooth. In addition, after the upper case 1 and the lower case 2 are assembled, the creepage distance formed between the connection portions 11 and 12 is not long enough, so the electric leakage may occur, which indirectly influence the electric properties of the electronic apparatus or its accessory.

Therefore, it is needed to provide an assembly structure of a case and the assembling method therefor which can decrease the formation of shade or flow mark on the case and increase the creepage distance of the assembled case to overcome the disadvantages of the prior art as described above.

SUMMARY OF THE INVENTION

It is an object of the present invention to provide an assembly structure of a case and the assembling method therefor applied to an electronic apparatus or its accessory, which can decrease the formation of shade or flow mark on the case and increase the creepage distance of the assembled case, so as to improve the case appearance and the electric properties of the electronic apparatus or its accessory.

In accordance with an aspect of the present invention, the assembly structure of a case comprises an upper case having a connection portion comprising a first cavity, a first protrusion, a first trench and a second protrusion arranged from the external side to the internal side thereof, and a lower case having a connection portion comprising a first cavity, a first protrusion and a second cavity arranged from the external side to the internal side thereof. Both the first cavity and the first protrusion of the upper case are opposite to the first cavity of the lower case, and the first trench and the second protrusion of the upper case are opposite to the first protrusion and the second cavity of the lower case, respectively, so as to assemble the upper case and the lower case.

In an embodiment, the first protrusion of the lower case further has a protruding rib to be implanted into the first trench of the upper case when the upper case and the lower case are assembled. The width of the first protrusion of the lower case is slightly smaller than that of the first trench of the upper case. Preferably, the upper case and the lower case are assembled by ultrasonic welding.

In another embodiment, the upper case and the lower case are assembled by engagement or screwing.

In accordance with another aspect of the present invention, the assembly structure of a case comprises an upper case having a connection portion comprising a first cavity, a first protrusion, a first trench and a second protrusion arranged from the external side to the internal side thereof, and a lower case having a connection portion comprising a first protrusion, a first trench, a second protrusion and a first cavity arranged from the external side to the internal side thereof. The first cavity, the first protrusion, the first trench and the second protrusion of the upper case are opposite to the first protrusion, the first trench, the second protrusion and the first cavity of the lower case, respectively, so as to assemble the upper case and the lower case.

In an embodiment, the first protrusion of the upper case further has a protruding rib to be implanted into the first trench of the lower case when the upper case and the lower case are assembled. The width of the first protrusion of the upper case is slightly smaller than that of the first trench of the lower case, and the width of the second protrusion of the lower case is slightly smaller than that of the first trench of the upper case. Preferably, the upper case and the lower case are assembled by ultrasonic welding.

In another embodiment, the upper case and the lower case are assembled by engagement or screwing.

In accordance with an additional aspect of the present invention, the assembling method of a case comprises steps of: (a) forming an upper case and a lower case, wherein the upper case has a connection portion comprising a first cavity, a first protrusion, a first trench and a second protrusion arranged from the external side to the internal side thereof, and the lower case has a connection portion comprising a first cavity, a first protrusion and a second cavity arranged from the external side to the internal side thereof; and (b) putting the first cavity and the first protrusion of the upper case in opposition to the first cavity of the lower case, and putting the first trench and the second protrusion of the upper case in opposition to the first protrusion and the second cavity of the lower case, respectively, and then assembling the upper case and the lower case.

In an embodiment, the assembling method further comprises forming a protruding rib on the first protrusion of the lower case, wherein the protruding rib is to be implanted into the first trench of the upper case.

In an embodiment, the step (a) is performed by injection molding.

In accordance with an further aspect of the present invention, the assembling method of a case comprises steps of: (a) forming an upper case and a lower case, wherein the upper case has a connection portion comprising a first cavity, a first protrusion, a first trench and a second protrusion arranged from the external side to the internal side thereof, and the lower case has a connection portion comprising a first protrusion, a first trench, a second protrusion and a first cavity arranged from the external side to the internal side thereof; and (b) putting the first cavity, the first protrusion, the first trench and the second protrusion of the upper case in opposition to the first protrusion, the first trench, the second protrusion and the first cavity of the lower case, respectively, and assembling the upper case and the lower case.

In an embodiment, the assembling method further comprises forming a protruding rib on the first protrusion of the upper case, wherein the protruding rib is to be implanted into the first trench of the lower case.

In an embodiment, the step (a) is performed by injection molding.

The above objects and advantages of the present invention will become more readily apparent to those ordinarily skilled in the art after reviewing the following detailed description and accompanying drawings, in which:

BRIEF DESCRIPTION OF THE DRAWINGS

FIGS. 6(a)–(b) schematically show the assembling manner of the structure in FIG. 5.

DETAILED DESCRIPTION OF THE PREFERRED EMBODIMENT

Figure 1:
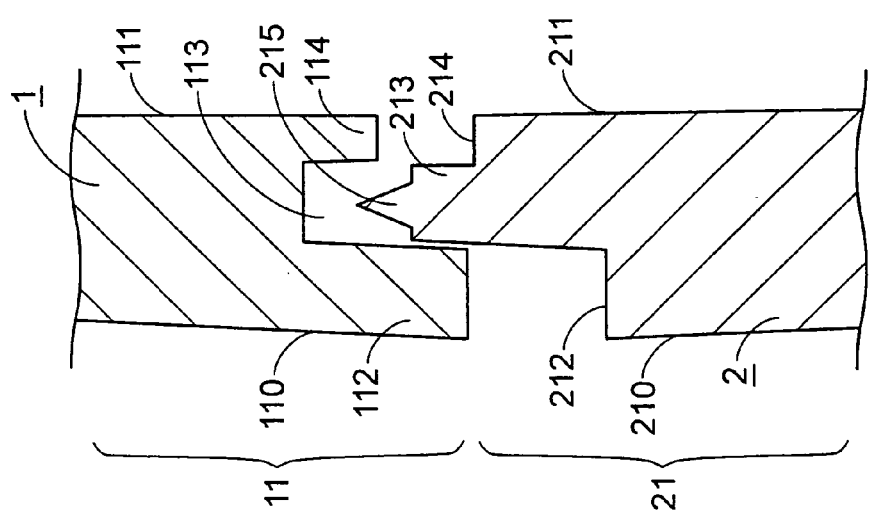
FIG. 1 is a schematic view showing the assembly structure of a conventional case.
Figure 2B:
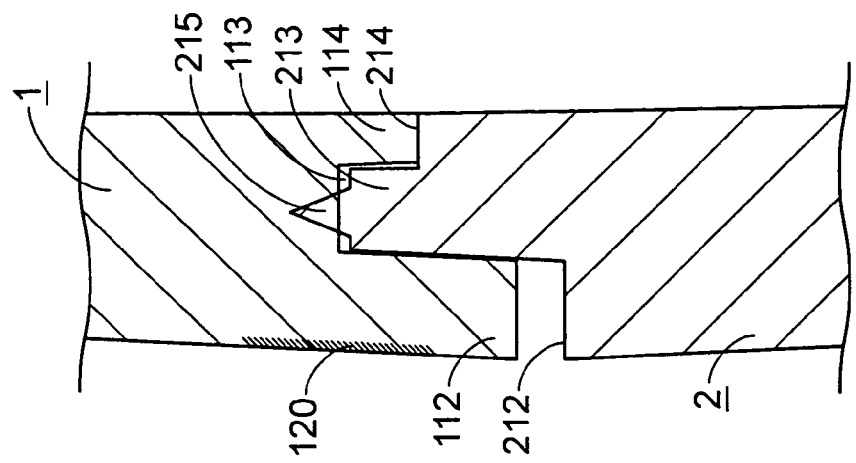
FIGS. 2(a)–(b) schematically show the assembling manner of the structure in FIG. 1.
Figure 2A:
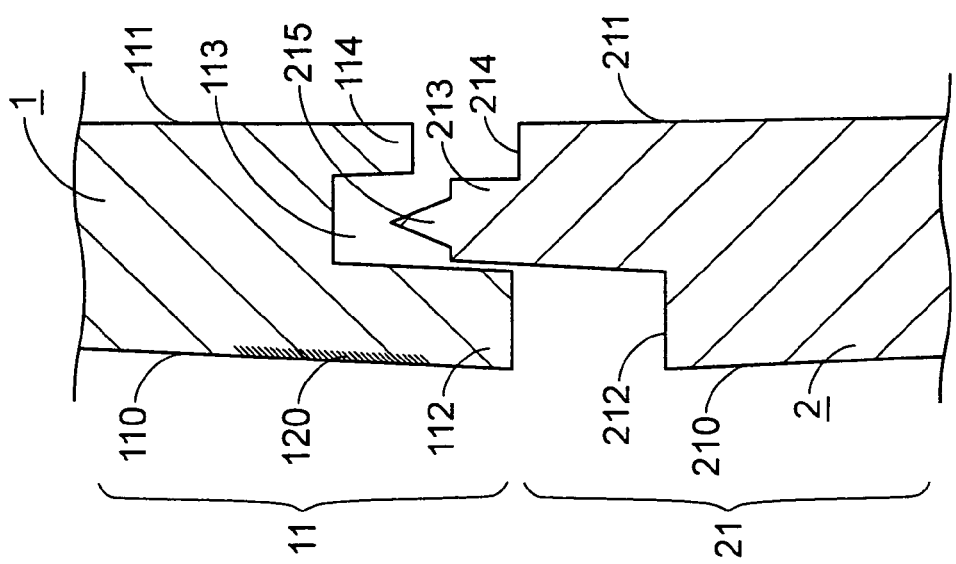
Figure 3:
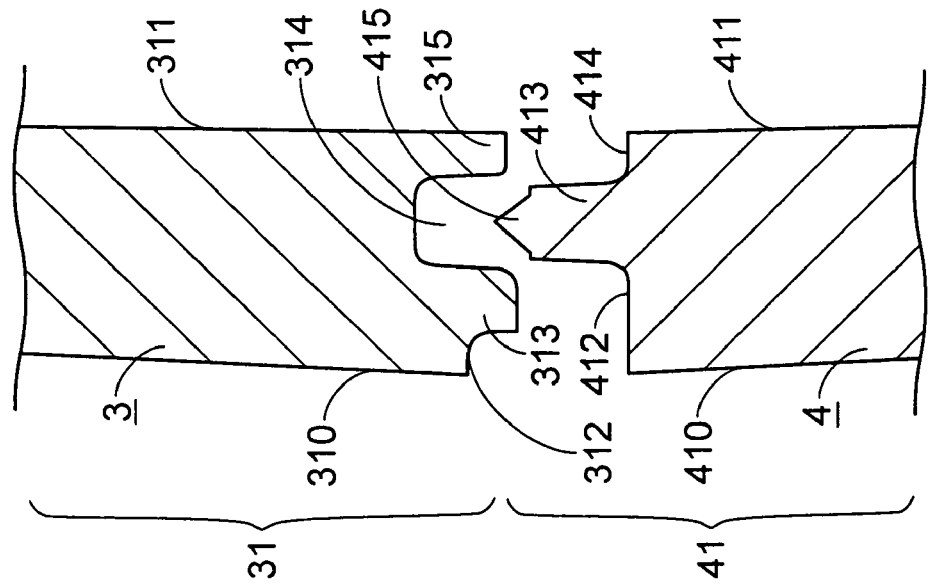
FIG. 3 is a schematic view showing the assembly structure of a case according to a preferred embodiment of the present invention.

Please refer to FIG. 3, which is a schematic view showing the assembly structure of a case according to a preferred embodiment of the present invention. As shown in FIG. 3, the assembly structure of the case of the present invention is composed of an upper case 3 and a lower case 4. The upper case 3 has a connection portion 31 including a first cavity 312, a first protrusion 313, a first trench 314 and a second protrusion 315 arranged from the external side 310 to the internal side 311 of the upper case 3. The lower case 4 also has a connection portion 41 including a first cavity 412, a first protrusion 413 and a second cavity 414 arranged from the external side 410 to the internal side 411 of the lower case 4. In this embodiment, both the first cavity 312 and the first protrusion 313 of the upper case 3 are opposite to the first cavity 412 of the lower case 4 and their widths are approximately equal. Furthermore, the first trench 314 and the second protrusion 315 of the upper case 3 are opposite to the first protrusion 413 and the second cavity 414 of the lower case 4, respectively. In addition, the first protrusion 413 of the lower case 4 has a protruding rib 415 thereon, and the width of the first protrusion 413 of the lower case 4 is slightly smaller than that of the first trench 313 of the upper case 3. Thereby, when the upper case 3 and the lower case 4 are assembled, the first protrusion 413 of the lower case 4 can be inserted into the first trench 313 of the upper case 3.

Figure 4B:
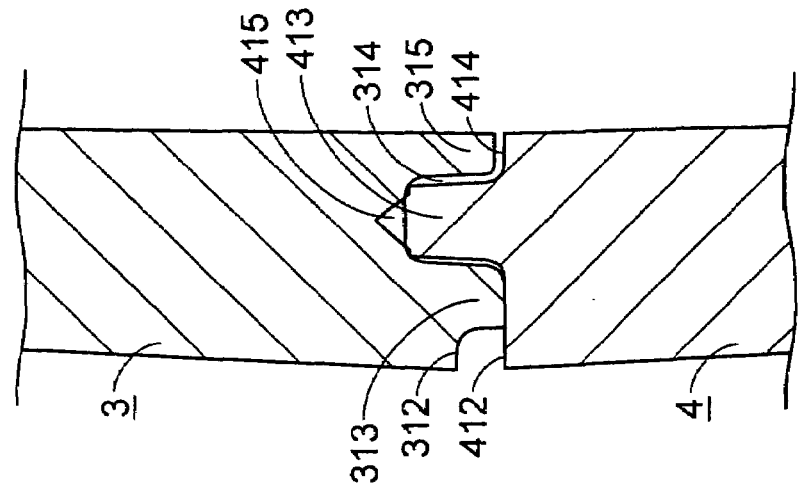
FIGS. 4(a)–(b) schematically show the assembling manner of the structure in FIG. 3.
Figure 4A:
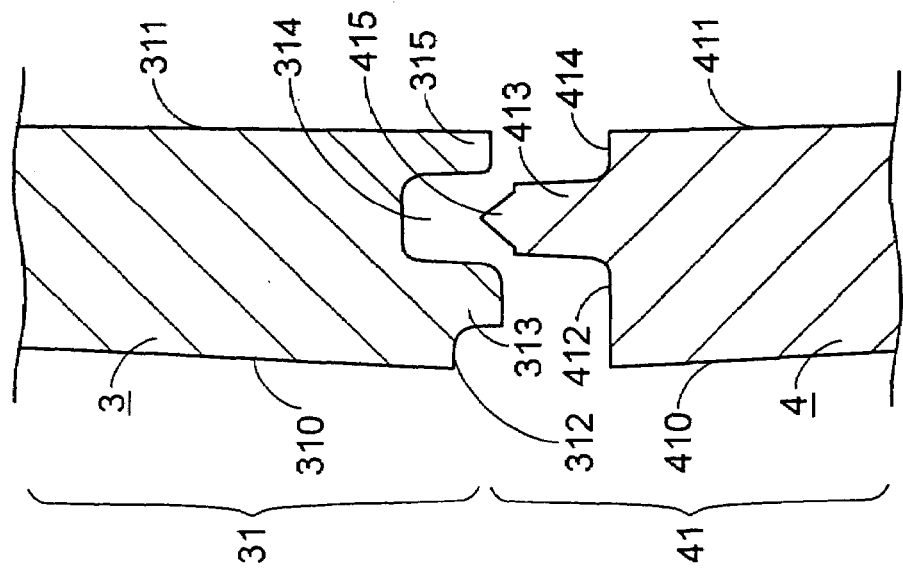

Please refer to FIGS. 4(a)–(b), which schematically show the assembling manner of the structure in FIG. 3. As shown in FIG. 4(a), when the upper case 3 and the lower case 4 are going to be assembled, the first cavity 312 with the first protrusion 313, the first trench 314, and the second protrusion 315 of the upper case 3 are first put in opposition to the first cavity 412, the first protrusion 413 and the second cavity 414 of the lower case 4, respectively. Then, with the ultrasound principle, the ultrasound generated by the horn of an ultrasonic plastic welding machine produces ultra-frequent sonic vibration on the cases, so that the upper case 3 and the lower case 4 rub against each other violently and thus the protruding rib 415 on the first protrusion 413 of the lower case 4 can be welded into the inner wall of the first trench 314 of the upper case 3 in a very short time, as shown in FIG. 4(b), so as to achieve the purpose of assembling the upper case 3 and the lower case 4. Certainly, the connection manner of the present invention is not limited to the ultrasonic welding as described above. For example, when the protruding rib 415 on the first protrusion 413 of the lower case 4 is not provided, the upper case 3 and the lower case 4 can also be assembled by engagement between the protrusion and the cavity/trench of the connection portions or by screwing.

As understood from FIG. 3, regardless of the upper case 3 or the lower case 4, the cavities are arranged first and followed by the protrusions from the external side to the internal side of the connection portions 31 and 41 of the cases, so that the shade or flow mark will not be formed on the external sides 310 and 410 of the upper case 3 and the lower case 4 when the upper case 3 and the lower case 4 are injection molded. With such structure design, no matter what method it uses to assemble the upper case 3 and the lower case 4, such as ultrasonic welding, engagement or screwing, the shade or flow mark will not be formed on the connection portions of the cases. Moreover, after the upper case 3 and the lower case 4 are assembled, the gap distance between the connection portions 31 and 41 is obviously longer than that of the prior art, and therefore, the creepage distance is increased and the electric properties is enhanced as well.

Figure 5:
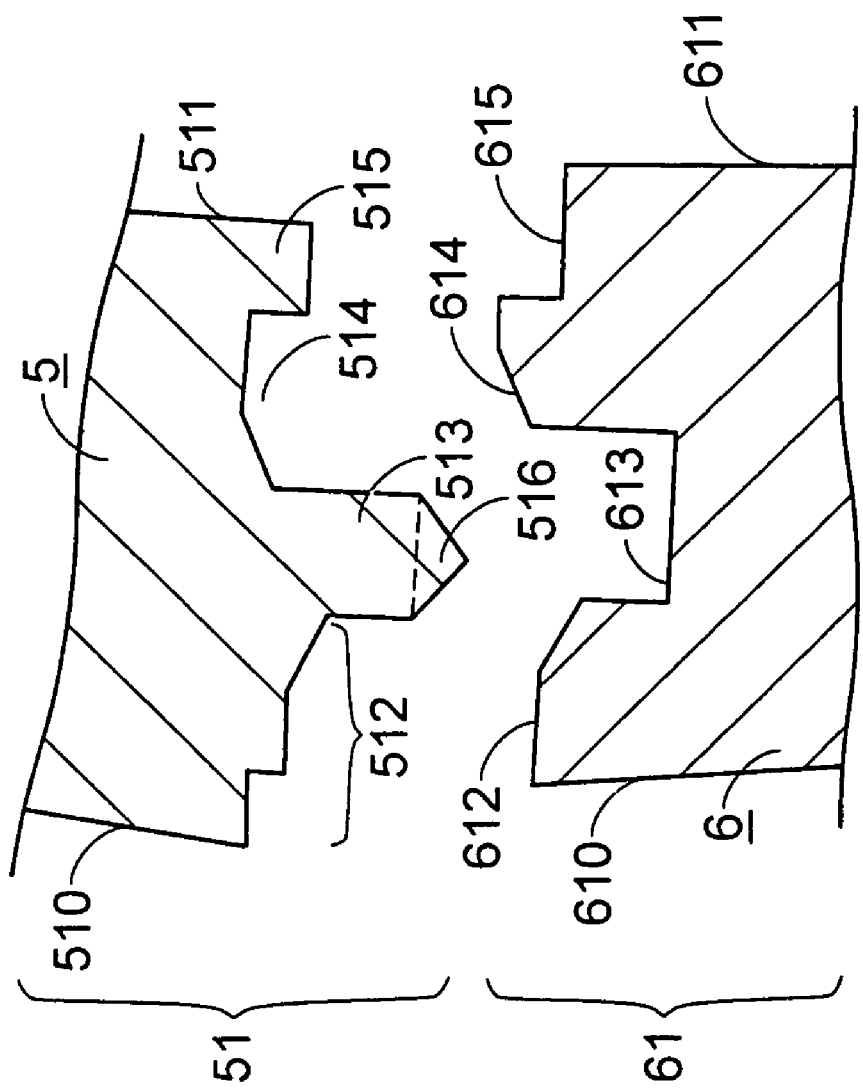
FIG. 5 is a schematic view showing the assembly structure of a case according to another preferred embodiment of the present invention.

Please refer to FIG. 5, which is a schematic view showing the assembly structure of a case according to another preferred embodiment of the present invention. In this embodiment, the assembly structure of the case is also composed of an upper case 5 and a lower case 6. The upper case 5 has a connection portion 51 including a first cavity 512, a first protrusion 513, a first trench 514 and a second protrusion 515 arranged from the external side 510 to the internal side 511 of the upper case 5. The lower case 6 also has a connection portion 61 including a first protrusion 612, a first trench 613, a second protrusion 614 and a first cavity 615 arranged from the external side 610 to the internal side 611 of the lower case 6. In this embodiment, the first cavity 512, the first protrusion 513, the first trench 514 and the second protrusion 515 of the upper case 5 are opposite to the first protrusion 612, the first trench 613, the second protrusion 614 and the first cavity 615 of the lower case 6, respectively. In addition, the first protrusion 513 of the upper case 5 has a protruding rib 516 thereon, and the width of the first protrusion 513 of the upper case 5 is slightly smaller than that of the first trench 613 of the lower case 6; the width of the second protrusion 614 of the lower case 6 is slightly smaller than that of the first trench 514 of the upper case 5. Thereby, when the upper case 5 and the lower case 6 are assembled, the first protrusion 513 of the upper case 5 can be inserted into the first trench 613 of the lower case 6, and the second protrusion 614 of the lower case 6 can be inserted into the first trench 514 of the upper case 5.

Please refer to FIGS. 6(a)–(b), which schematically show the assembling manner of the structure in FIG. 5. As shown in FIG. 6(a), when the upper case 5 and the lower case 6 are going to be assembled, the first cavity 512, the first protrusion 513, the first trench 514, and the second protrusion 515 of the upper case 5 are first put in opposition to the first protrusion 612, the first trench 613, the second protrusion 614 and the first cavity 615 of the lower case 6, respectively.

Then, with the ultrasound principle, the ultrasound generated by the horn of an ultrasonic plastic welding machine produces ultra-frequent sonic vibration on the cases, so that the upper case 5 and the lower case 6 rub against each other violently and thus the protruding rib 516 on the first protrusion 513 of the upper case 5 can be welded into the inner wall of the first trench 613 of the lower case 6 in a very short time, as shown in FIG. 6(b), so as to achieve the purpose of assembling the upper case 5 and the lower case 6. Certainly, the connection manner of the present invention is not limited to the ultrasonic welding as described above. For example, when the protruding rib 516 on the first protrusion 513 of the upper case 5 is not provided, the upper case 5 and the lower case 6 can also be assembled by engagement between the protrusion and the cavity/trench of the connection portions or by screwing. Besides, in this embodiment, the profiles on the connection surfaces of the connection portions 51 and 61 of the upper case 5 and the lower case 6 can have some variations of inclination or level difference on the inner wall of each protrusion or cavity/trench, as shown in FIG. 5, so as to increase the creepage distance after the upper case 5 and the lower case 6 are assembled.

As understood from FIG. 5, the cavity are arranged first and followed by the protrusion from the external side 510 to the internal side 511 of the connection portion 51 of the upper case 5, so that the shade or flow mark will not be formed on the external side 510 of the upper case 5 when the upper case 5 is injection molded. In addition, due to the specific profile design on the connection surfaces of the connection portions 51 and 61 of the upper case 5 and the lower case 6, the height of the first protrusion 612 of the lower case 6 can be smaller than that of the prior art, and the width thereof can be bigger than that of the prior art; hence, the thickness difference on the cross-section of the lower case 6 is smaller (the wall thickness of the case is more even), so that the shade or flow mark will not be easily formed on the external side 610 of the lower case 6. With such structure design, no matter what method it uses to assemble the upper case 5 and the lower case 6, such as ultrasonic welding, engagement or screwing, the shade or flow mark will not be formed on the connection portions of the cases. Moreover, after the upper case 5 and the lower case 6 are assembled, the gap distance between the connection portions 51 and 61 is obviously longer than that of the prior art, and therefore, the creepage distance is increased and the electric properties is enhanced as well.

Figure 7:
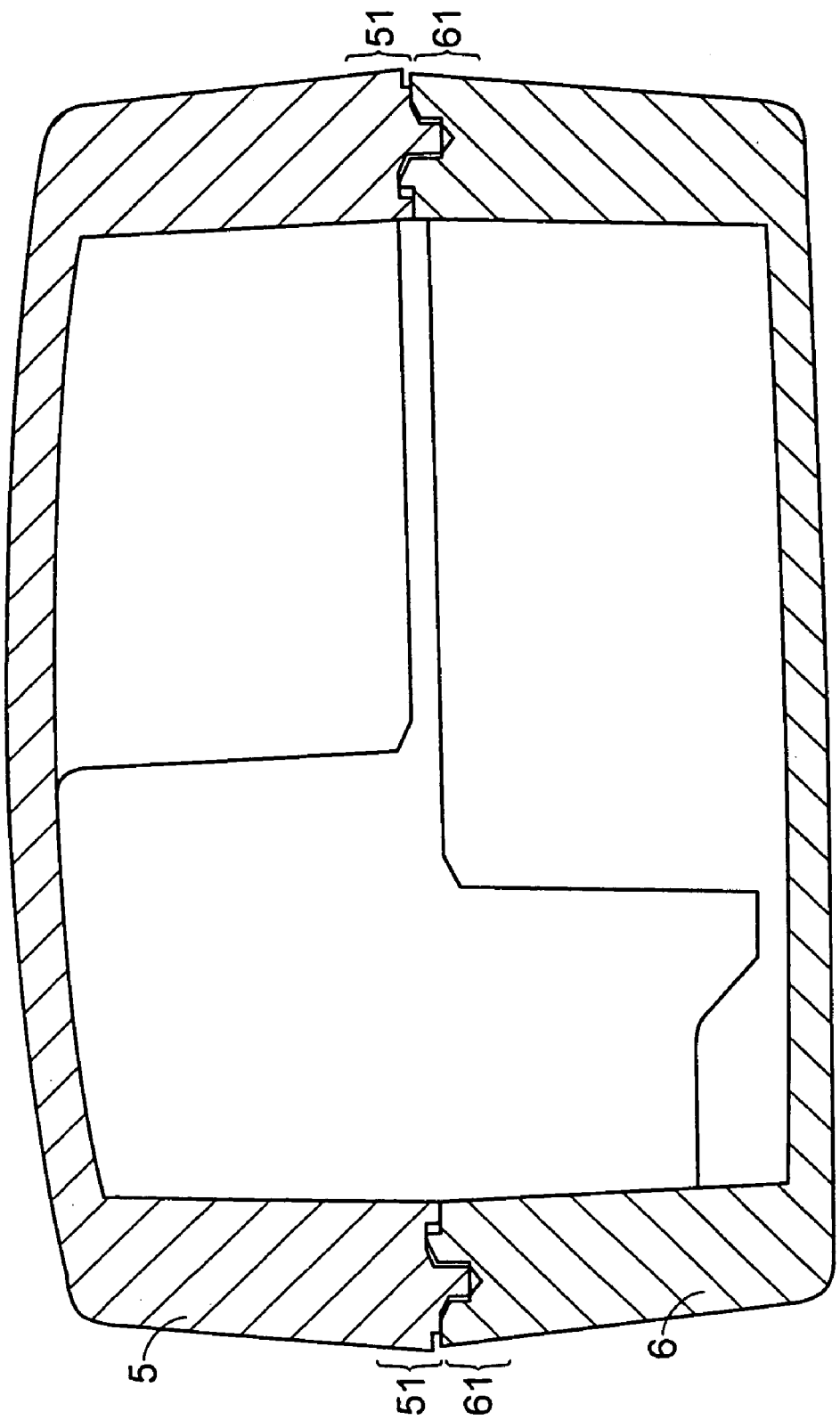
FIG. 7 is a schematic view showing the structure of the assembled case according to a preferred embodiment of the present invention.

Please refer to FIG. 7, which is a schematic view showing the structure of the assembled case according to a preferred embodiment of the present invention. As shown in FIG. 7, after the upper case 5 and the lower case 6 are assembled via the connection portions 51 and 61, the assembled case is fixed well, and the drop test thereof can reach to 1.5 m, so the performance and anti-shock ability of the electronic apparatus or accessory are increased.

In conclusion, since the assembly structure of the case according to the present invention has specific profiles on the connection surfaces of the connection portions of the upper and the lower cases, the formation of shade or flow mark can be decreased during the injection molding process and the case can be smoother. In addition, with such structure design, the creepage distance of the electronic apparatus or accessory can be increased and the electric properties thereof can be enhanced. Therefore, the present invention possesses the industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembly structure of a case, comprising:
   an upper case having a connection portion comprising a first cavity, a first protrusion, a first trench and a second protrusion arranged from the external side to the internal side thereof; and
   a lower case having a connection portion comprising a first cavity, a first protrusion and a second cavity arranged from the external side to the internal side thereof;
   wherein both said first cavity and said first protrusion of said upper case are opposite to said first cavity of said lower case, and said first trench and said second protrusion of said upper case are opposite to said first protrusion and said second cavity of said lower case, respectively, so as to assemble said upper case and said lower case.

2. The assembly structure according to claim 1 wherein said first protrusion of said lower case further has a protruding rib to be implanted into said first trench of said upper case when said upper case and said lower case are assembled.

3. The assembly structure according to claim 1 wherein the width of said first protrusion of said lower case is slightly smaller than that of said first trench of said upper case.

4. The assembly structure according to claim 1 wherein said upper case and said lower case are assembled by ultrasonic welding.

5. The assembly structure according to claim 1 wherein said upper case and said lower case are assembled by engagement or screwing.

6. An assembly structure of a case, comprising:
   an upper case having a connection portion comprising a first cavity, a first protrusion, a first trench and a second protrusion arranged from the external side to the internal side thereof; and
   a lower case having a connection portion comprising a first protrusion, a first trench, a second protrusion and a first cavity arranged from the external side to the internal side thereof;
   wherein said first cavity, said first protrusion, said first trench and said second protrusion of said upper case are opposite to said first protrusion, said first trench, said second protrusion and said first cavity of said lower case, respectively, so as to assemble said upper case and said lower case.

7. The assembly structure according to claim 6 wherein said first protrusion of said upper case further has a protruding rib to be implanted into said first trench of said lower case when said upper case and said lower case are assembled.

8. The assembly structure according to claim 6 wherein the width of said first protrusion of said upper case is slightly smaller than that of said first trench of said lower case.

9. The assembly structure according to claim 6 wherein the width of said second protrusion of said lower case is slightly smaller than that of said first trench of said upper case.

10. The assembly structure according to claim 6 wherein said upper case and said lower case are assembled by ultrasonic welding.

11. The assembly structure according to claim 6 wherein said upper case and said lower case are assembled by engagement or screwing.

12. An assembling method of a case, comprising steps of:
   (a) forming an upper case and a lower case, wherein said upper case has a connection portion comprising a first cavity, a first protrusion, a first trench and a second protrusion arranged from the external side to the internal side thereof, and said lower case has a connection portion comprising a first cavity, a first protrusion and a second cavity arranged from the external side to the internal side thereof; and
   (b) putting said first cavity and said first protrusion of said upper case in opposition to said first cavity of said lower case, and putting said first trench and said second protrusion of said upper case in opposition to said first protrusion and said second cavity of said lower case, respectively, and then assembling said upper case and said lower case.

13. The assembling method according to claim 12 further comprising forming a protruding rib on said first protrusion of said lower case, wherein said protruding rib is to be implanted into said first trench of said upper case.

14. The assembling method according to claim 12 wherein said step (a) is performed by injection molding.

15. The assembling method according to claim 12 wherein said upper case and said lower case are assembled by ultrasonic welding.

16. The assembling method according to claim 12 wherein said upper case and said lower case are assembled by engagement or screwing.

17. An assembling method of a case, comprising steps of:
   (a) forming an upper case and a lower case, wherein said upper case has a connection portion comprising a first cavity, a first protrusion, a first trench and a second protrusion arranged from the external side to the internal side thereof, and said lower case has a connection portion comprising a first protrusion, a first trench, a second protrusion and a first cavity arranged from the external side to the internal side thereof; and
   (b) putting said first cavity, said first protrusion, said first trench and said second protrusion of said upper case in opposition to said first protrusion, said first trench, said second protrusion and said first cavity of said lower case, respectively, and assembling said upper case and said lower case.

18. The assembling method according to claim 17 further comprising forming a protruding rib on said first protrusion of said upper case, wherein said protruding rib is to be implanted into said first trench of said lower case.

19. The assembling method according to claim 17 wherein said step (a) is performed by injection molding.

20. The assembling method according to claim 17 wherein said upper case and said lower case are assembled by ultrasonic welding.

21. The assembling method according to claim 17 wherein said upper case and said lower case are assembled by engagement or screwing.

* * * * *